United States Patent
Stacey et al.

(10) Patent No.: US 10,705,040 B2
(45) Date of Patent: Jul. 7, 2020

(54) SENSING LAYER FORMATION (71) Applicant: Sciosense B.V., AE Eindhoven (NL)

(72) Inventors: Simon Jonathan Stacey, Ely (GB); Matthew Govett, Cambridge (GB); Syed Zeeshan Ali, Cambridge (GB)

(73) Assignee: Sciosense B.V., AE Eindhoven (NL)

( * ) Notice: Subject to any disclaimer, the term of this patent is extended or adjusted under 35 U.S.C. 154(b) by 0 days.

(21) Appl. No.: 16/061,428

(22) PCT Filed: Dec. 13, 2016

(86) PCT No.: PCT/GB2016/053921
§ 371 (c)(1),
(2) Date: Jun. 12, 2018

(87) PCT Pub. No.: WO2017/103577
PCT Pub. Date: Jun. 22, 2017

(65) Prior Publication Data
US 2019/0041346 A1 Feb. 7, 2019

(30) Foreign Application Priority Data
Dec. 14, 2015 (GB) .................... 1521999.1

(51) Int. Cl.
*H01L 21/00* (2006.01)
*G01N 27/12* (2006.01)
*H01L 21/67* (2006.01)

(52) U.S. Cl.
CPC ..... *G01N 27/128* (2013.01); *H01L 21/67103* (2013.01); *H01L 21/67115* (2013.01)

(58) Field of Classification Search
CPC ............ G01N 27/128; H01L 21/67103; H01L 21/67115
See application file for complete search history.

(56) References Cited

U.S. PATENT DOCUMENTS 8,669,131 B1 3/2014 Smith et al.
2009/0239371 A1 9/2009 Mayer et al.
(Continued)

FOREIGN PATENT DOCUMENTS

CN 108369204 A * 8/2018 ....... H01L 21/67103
EP 2837932 A1 * 2/2015
(Continued)

OTHER PUBLICATIONS

Udrea, F., et al. article entitled "CMOS Micro-Hotplate Array Design for Nanomaterial-Based Gas Sensors," Department of Engineering, University of Cambridge, BNSDOCID: <XP_31372864A-1_>, pp. 143-146 (2008).
(Continued)

*Primary Examiner* — Laura M Menz
(74) *Attorney, Agent, or Firm* — Kilpatrick Townsend & Stockton LLP (57) ABSTRACT

We disclose herein a method for heating a gas sensing material formulation on a microhotplate which comprises: a dielectric membrane formed on a semiconductor substrate comprising an etched portion; and the gas sensing material formulation being located on one side of the dielectric membrane. The method comprising: selectively heating the gas sensing material formulation using an infra-red (IR) heater located over the substrate, and controllably cooling the semiconductor substrate using a cooling baseplate provided under the substrate and using an insulating medium located between the substrate and the cooling base plate so that a gas sensing structure is formed on said one side of the dielectric membrane from the gas sensing material formulation.

18 Claims, 5 Drawing Sheets

(56) References Cited

U.S. PATENT DOCUMENTS

| | | | |
|---|---|---|---|
| 2011/0174799 A1 | 7/2011 | Ali et al. | |
| 2011/0290003 A1 | 12/2011 | Liu et al. | |
| 2012/0094030 A1 | 4/2012 | Maedler et al. | |
| 2015/0050430 A1* | 2/2015 | Muecke | G01N 27/128 |
| | | | 427/557 |
| 2017/0221959 A1* | 8/2017 | Udrea | G01J 5/20 |
| 2017/0343419 A1* | 11/2017 | Hopper | H01L 35/32 |
| 2017/0343500 A1* | 11/2017 | Udrea | G01N 27/123 |
| 2019/0041346 A1* | 2/2019 | Stacey | G01N 27/128 |

FOREIGN PATENT DOCUMENTS

| | | | | |
|---|---|---|---|---|
| EP | 2837932 A1 | | 2/2015 | |
| EP | 3391035 A1 | * | 10/2018 | G01N 27/128 |
| GB | 2321336 A | | 7/1998 | |
| GB | 2464016 A | | 4/2010 | |
| GB | 2523788 A | | 9/2015 | |
| GB | 2545426 A | * | 6/2017 | G01N 27/128 |
| KR | 20190041346 A | * | 4/2019 | |
| WO | 2010129411 A2 | | 11/2010 | |
| WO | 2014007603 A2 | | 1/2014 | |
| WO | WO-2017103577 A1 | * | 6/2017 | H01L 21/67103 |

OTHER PUBLICATIONS

Barrettino, M. Graf, D., et al., article entitled "Smart Single-Chip CMOS Microhotplate Array for Metal-Oxide-Based Gas Sensors," Physical Electronics Laboratory, ETH Zurich, HPT H8, CH-8093 Zurich, Switzerland, The 12th International Conference on Solid Stale Sensors, Actuators and Microsystems, Boston, BNSDOCID: <XP_ ~3237746A1 >, pp. 123-126, dated Jun. 8-12, 2003.
UKIPO International Search Report for Application No. GB1521999. 1, dated May 6, 2016 in 4 pages.

\* cited by examiner

SENSING LAYER FORMATION

This application is a U.S. National Phase Application of PCT/GB2016/053921, filed Dec. 13, 2016, which claims priority to European Patent Application No. 1521999.1, filed Dec. 14, 2015, the entireties of which are incorporated by reference herein.

FIELD OF THE INVENTION

This invention relates to selective area heating of membrane based sensors using infra-red (IR) heating with a controlled cooling technique.

BACKGROUND OF THE INVENTION

Metal oxide (MOX) gas sensors are a well-established technology and are based on the deposition of a metal oxide film onto sensing electrodes defined on or within a suitable substrate. The substrate could be a ceramic or, more recently, a silicon substrate. The deposition process could use a thin film technology, such as sputtering, atomic layer deposition or chemical vapour deposition, or a thick film technology such as screen printing, drop coating or ink jetting. In the latter case the film could be deposited in the form of an ink or paste where metal oxide grains are held in suspension in a suitable vehicle, often comprising of organic solvents. This vehicle generally needs to be driven off the powder and any organic compounds decomposed to leave an uncontaminated metal oxide. Furthermore, the metal oxide grains generally need to be "fired" to form a mechanically robust, stable and porous structure which adheres to the substrate and the sensing electrodes.

The drying and organic decomposition processes generally require temperatures up to ~300° C. but the firing process requires higher temperatures. These temperatures are dependent on many variables such as the starting metal oxide material, the dopants and/or catalysts added to the materials, the metal oxide grain size, the film thickness and the required final structure and porosity. Generally these temperatures exceed 500° C. so care needs to be taken not to adversely affect the quality of the other materials in the sensor such as the substrate, the sensing electrodes and any interconnects.

The use of ceramic substrates generally alleviates some of these sensitivities to processing at elevated temperatures but the use of silicon substrates, particularly CMOS compatible silicon substrates causes some concern. For example, CMOS wirebond pads are generally Aluminum which will readily degrade at temperatures greater than about 400° C. which renders them unsuitable for wire-bonding or providing an Ohmic interconnect. Addition of CMOS circuits to the substrate for control, processing or memory functions are equally at risk to elevated temperatures.

Typical annealing processes using standard conduction and/or convection ovens compromises the final quality of the substrate and any circuits or interconnects contained therein.

Most MOX firing/heating is performed indiscriminately so is not CMOS compatible unless lower than optimum temperatures are deployed which results in compromised sensor quality and performance, as demonstrated in U.S. Pat. No. 8,669,131 B1.

To date various methods are deployed for selective heating such as laser annealing or built in heaters. Both of these methods are slow and costly so not suited to high volume manufacture.

Other methods involve the use of thin films such as CVD or sputtering which do not generally require a post firing process, as demonstrated in US 20110290003 A1.

For metal oxide processing it is possible to use flame spray pyrolysis which utilises a shadow mask to ensure selective deposition and simultaneous firing. This method prevents the user from making changes to the material properties such as porosity and grain size that are essential to produce a quality gas sensor. This method also relies on a shadow mask for selecting the deposition area as the deposition technique is indiscriminate and therefore wasteful of materials that can be very costly as they are likely to contain noble metal dopants and/or catalysts. This is demonstrated in US 20120094030 A1.

Conventional rapid thermal processing (RTP) has been used for firing ceramic films but does not leverage the advantage of selective area heating due to the process and structure used. This is demonstrated in WO 2010129411 A2.

SUMMARY

Aspects and preferred features are set out in the accompanying claims.

According to the invention, there is provided a method for heating a gas sensing material formulation on a micro-hotplate structure in which infrared radiation is used in conjunction with a cooled base plate and thermally insulating medium to selectively heat the gas sensing material formulation to form a gas sensing structure. The micro-hotplate structure comprises a heater embedded within a membrane supported by a semiconductor substrate with the gas sensing material either above or below the membrane. The heating setup includes a base plate, a wafer full of micro-hotplate structures, a thermally insulating medium between the wafer and the base plate, and the IR radiation source above the wafer. The advantage of this configuration is that the IR radiation heats the gas sensing material formulation and the dielectric membrane to a much higher temperature than the cooled substrate due to the thermal isolation provided by the membrane structure. The use of a thermally isolating intermediate medium reduces (prevents) excessive cooling of the substrate which would lead to unnecessary heat loss from the system and potential thermal expansion mismatch issues within the structure. Electrodes may also be present above or below the membrane in contact with the sensing material.

It would be appreciated that the electrode and gas sensing structure are formed on the dielectric membrane substantially within the area of the etched portion of the substrate. The term "selectively heating" refers to heating the area in which the sensing structure is formed to a high temperature (e.g. 600° C.) and cooling the remaining area of the substrate in which no electrode and sensing structure are formed to a relatively low temperature via the thermal insulating medium and the cooled base plate. The etched portion of the substrate (in which no semiconductor material is present) has low thermal conductivity and therefore the area (where the gas sensing structure is formed) in the dielectric membrane above the etched portion experiences higher temperature than the remaining area of the dielectric membrane.

It would be also appreciated that the term "gas sensing material formulation" refers to a gas sensitive material including a powder and a material vehicle mixed together. When the formulation is exposed to a sufficiently high temperature the material formulation can transform into a porous sensing structure or a sensing layer, which is referred to as the gas sensing structure.

The thermally insulating medium can be a plate of material with low thermal conductivity, such as glass, quartz or a ceramic. The thickness of the plate can be selected to give the appropriate level of thermal difference between the cooled base plate temperature and the wafer (substrate) temperature (e.g. between 100 µm and 5 cm). Alternately the insulating material can be air or one or more mixture of gases, and in this case the separation between the wafer and the cooling base plate is created by the use of pins, or a support structure on the edge of the wafer. The height of the support structure, as well as the surrounding gas composition and pressure can be varied to alter the thermal path from the wafer to the cooling base plate (e.g. a height between 100 µm and 10 cm). The gases could be air, nitrogen, oxygen, carbon monoxide, helium, argon or a mixture of these. The pressure maybe varied between for example between vacuum up to 10 Bar. It would be appreciated that the insulating medium forms part between the non-etched portion of the substrate and the cooling plate. The area within the etched portion should not be considered as an area between the substrate and the cooling plate. The vertical distance between the substrate and cooling plate is where the insulating medium is provided.

There can also be an additional material (or thermally conducting material or layer) between the thermally insulating medium and the wafer which has a high thermal conductivity compared to the insulating medium. Example materials can be silicon, silicon carbide, graphite, metal, or a composition of these materials.

This invention enables a simple, high throughput process for the selective heating of metal oxide in the formation of a membrane based gas sensor. Furthermore, the process enables the monolithic integration of CMOS materials, structures, circuits and interconnects. The process provides freedom to the user to modify material properties and firing temperatures independently. This will enhance the sensor performance and manufacturing yields by allowing the user to: —

Select appropriate deposition techniques for throughput, flexibility and cost

Adjust ink or paste formulation to improve deposition accuracy, repeatability and quality Modify the material dopants and/or catalysts for gas selectivity and discrimination Optimise the material grain size for sensor sensitivity and stability Control MOX porosity and thickness to maximise sensor sensitivity and response time Adjust the firing profile to optimise MOX adhesion and cohesion to maximise yield and reliability The step of selectively heating may be conducted by using a rapid thermal process (RTP).

The substrate may be back-etched such that the dielectric membrane is supported along its entire perimeter by the semiconductor substrate and the etched portion is located in a central region of the substrate. The electrode and the sensing structure are formed within the area defined by the etched portion which is located in the central region of the substrate. Alternately the dielectric membrane maybe formed by a front side or back side etch, but be supported by a few beams rather than a full membrane. This alternate structure may be formed from the silicon substrate itself forming a suspended structure providing thermal isolation from the surrounding silicon substrate.

The step of selectively heating may generate a second temperature in the substrate outside the membrane region which is substantially lower than the temperature on the membrane. This is because the IR radiation heat falling on the substrate dissipates through a higher thermal conductance path (e.g. to the cooled base plated via the thermally insulating medium), while the heat generated in the membrane due to IR radiation dissipates through a much lower thermal conductance path due to the thermal isolation of the membrane (e.g. due to the presence of the etched portion of the substrate in which the thermal conduction of air is low).

The step of selectively heating may generate the first temperature applied to the gas sensitive material formulation which does not substantially dissipate through the dielectric membrane and the etched portion of the semiconductor substrate under the electrode layer and the gas sensitive material formulation. This is because the thermal conductivity of the dielectric membrane and the etched portion filled with air are low and thus the gas sensitive material formulation is able to receive a set (high) temperature applied by an IR heater.

The step of selectively heating may comprise using a cooling plate coupled with the etched substrate via the use of a thermally insulating medium. The cooling structure or plate may dissipate a portion of the heat from the adjacent semiconductor substrate during the selectively heating process to result in the second temperature in the area (along the perimeter) of the dielectric membrane on which no electrode layer and sensing structure are formed. The cooling structure or plate may be cooled by the use of water, the temperature of which can be set based on the degree of thermal coupling between the cooling structure and the substrate which, in turn, is controlled by the effective thermal conductivity of the insulating medium.

The first temperature may be set about 600° C. and the second temperature may be about or less than 400° C.

The step of selectively heating may be generated by a plurality of infra-red (IR) heaters. Alternatively the step of selectively heating may be generated by a pulsed heating technique. The pulsed heating technique may be applied using a pulse frequency which generates the first temperature applied to the gas sensitive material formulation and generates the second temperature applied to the area of the dielectric membrane on which no electrode layer and sensing structure are formed. The pulsed heating can be with the IR heaters being completely on or off. Alternately the pulsed heating can be between two different power levels of the IR heater.

The gas sensitive material formulation may comprise a gas sensitive particulate (powder) material and a solvent. The solvent may be evaporated by the application of the first temperature to form the sensing structure.

The sensing structure may comprise a metal oxide material or a combination of metal oxides. The sensing structure may comprise a metal oxide material selected from a group comprising tin oxide, tungsten oxide, zinc oxide, chromium oxide, aluminium oxide.

The metal oxide material may be pure, doped or catalysed material. The sensing structure may be a porous layer. The sensing structure may be a gas sensitive layer.

The method may further comprise increasing the emissivity of sensing structure so that it can absorb infrared emission from the heaters.

The sensing structure may be deposited using a technique selected from a group including screen printing, sputtering, chemical vapour deposition (CVD), atomic layer deposition (ALD), ink-jet, drop coating and flame spray pyrolysis.

The step of selectively heating may be applied to an array of micro-hotplates. In this configuration it may be preferable to modify the temperature of each element in the array to optimise the heating of the gas sensing material formulation to form the appropriate gas sensing structure. This may be achieved by modifying the thermal conductivity of each membrane to either increase or decrease the heat loss from the selectively heated area. The modification of the thermal conductivity may be achieved, for example, by adjusting the amount of metal contained within the membrane structure so that higher metal content results in higher thermal conductivity and, thus, lower temperature in the selectively heated area.

The micro-hotplate may be a CMOS based micro-hotplate. The present invention provides a fully CMOS-compatible or CMOS-based micro-hotplate design based on a closed dielectric membrane structure. Here the closed dielectric membrane refers to a dielectric membrane in which the dielectric membrane is released by back etching of the underlying semiconductor substrate. The membrane is not connected to the substrate using any bridge structure (like in suspended membranes), but is supported along its entire perimeter by the substrate. The closed membrane structure is advantageous because it can be fabricated in the CMOS process using relatively less processing steps. Furthermore, the advantage of the closed-form back-etched membrane is that it is generally mechanically stable as the dielectric layers of the membrane are fully supported by the substrate. The electrodes of the micro-hotplate can be made of titanium nitride (TiN), tungsten, titanium tungsten (TiW), gold or platinum. TiN, TiW and tungsten are CMOS usable materials and thus when these materials are used as electrodes they can be manufactured within the CMOS process. Gold and platinum are not CMOS compatible and thus when these materials are used the electrodes are generally made outside the CMOS processing steps using a post-CMOS process.

The dielectric membrane may comprise:
a membrane cavity comprising vertical side walls or sloping side walls;
one or more dielectric layers comprising silicon dioxide and/or silicon nitride;
one or more layers of spin on glass, and
a passivation layer over the one or more dielectric layers.

The electrode layer may be formed over the first passivation layer of the dielectric membrane. Alternatively the electrode layer may be formed on the underside of the membrane with the sensing layer (or sensing structure) deposited within the etched cavity to provide a bottom side sensor.

The micro-hotplate may further comprise an adhesion or diffusion barrier layer between the passivation layer and the electrode layer.

The electrode layer may comprise a plurality of patterned structures.

The patterned structures may have one or more shapes selected from a group comprising:
(1) square and/or circular
(2) interdigitated electrodes
(3) electrodes arranged in shapes of concentric rings, and
(4) spiral shaped electrodes.

The micro-hotplate may further comprise a heater formed within or over the dielectric membrane. The heater may be a resistive heater comprising a CMOS usable material comprising aluminium, copper, titanium, molybdenum, polysilicon, single crystal silicon, tungsten, or titanium nitride. The heater may comprise a CMOS interconnect metal, and the dielectric membrane comprises CMOS dielectric layers.

The device is preferably fabricated using CMOS-based or CMOS-usable materials. Here the terms "CMOS-based" material or "CMOS-usable" material refer to the materials which are compatible in the state-of-art CMOS processing steps or CMOS process. In this case the heater may be a resistive heater made from CMOS materials such as tungsten, aluminium, titanium, polysilicon, molybdenum or single crystal silicon. The heater may also be a MOSFET heater to allow easier drive control. The dielectric membrane itself may include layers of silicon dioxide and/or silicon nitride as well as spin on glass. The starting wafer may be either bulk silicon, or a silicon on insulator (SOI) wafer. The membrane may be formed by back etching the supporting semiconductor substrate. The membrane cavity may either have near vertical sidewalls (formed by the use of Deep Reactive Ion Etching (DRIE)), or may have sloping sidewalls (formed by the use of anisotropic or crystallographic etching methods such as potassium hydroxide (KOH) or TetraMethyl Ammonium Hydroxide (TMAH)). The use of DRIE allows circular membranes to be made more easily.

Alternatively the device may also be fabricated with some or all non-CMOS materials. For example the heater may be fabricated from platinum, or a supporting substrate other than silicon may be used.

The dielectric membrane itself may be circular, rectangular, or rectangular shaped with rounded corners to reduce the stresses in the corners, but other shapes are possible. The membrane may also have one or more holes in it to avoid air being trapped on one side of the membrane. The top passivation of the device may be either silicon dioxide or silicon nitride. To improve the mechanical stability of the membrane, it may also have other structures embedded within the membrane. For example beams of metal or single crystal silicon may be embedded, or a metal or single crystal silicon layer covering the whole area of the membrane, or spin on glass for planarization and/or stress relief. Alternatively the structure may be a suspended structure where supporting beams are etched from the substrate material and are of dimensions suitable to provide thermal isolation between the sensing structure and the surrounding substrate.

In embodiments, there is provided a micro-hotplate comprising:
a dielectric membrane formed on a semiconductor substrate comprising a back-etched portion;
an electrode layer formed over or under the dielectric membrane, and
a sensing structure for gas sensing on the electrode layer, wherein the sensing structure is formed using the method as described above.

The process may have an additional step of using the membrane micro-heater which is above or embedded within the membrane to heat up the gas sensing formulation. This step may be performed before or after the heating by infrared. Alternately, there can be several cycles of heating, alternating between the infrared heating and the heating by the membrane heater. The heating by use of the membrane heater can be performed using a probe station to probe the bond pads of the heater and supply the required voltage or current. Either one device at a time maybe powered, or several devices on a wafer maybe powered at the same time. A feedback loop may be used during the heating process to keep the gas sensing formulation at a constant temperature. The amount of power supplied may be varied during the heating process using the membrane heater to vary the temperature over time. The amount of power supplied to the heater may be varied between different membrane heaters in order to provide different temperatures to heat a plurality of gas sensing formulations. Alternately the step using the membrane heater can also be performed after the device has been packaged.

There may also be a shadow mask above the wafer during the infrared heating. The shadow mask may comprise a plate with holes in it, the locations of the holes aligning with the locations of the membranes on the wafer. Such a structure only allows the infrared radiation to reach the membranes or just the sensing structure and not the areas of the wafer that do not have the membrane or sensing structure. The holes may also only expose some membranes or sensing structures to allow different amounts of IR radiation to reach different membranes or sensing structure in a multi step process, for example in case of a plurality of gas sensing formulations. The shadow mask can be made of a material with good thermal conductivity and/or high infrared reflectivity.

The size of the shadow mask can be the same as the wafer, or it can be larger. The shadow mask may extend up to the walls of the chamber used for the infrared heating.

BRIEF DESCRIPTION OF THE PREFERRED EMBODIMENTS

Some preferred embodiments of the invention will now be described by way of example only and with reference to the accompanying drawings, in which.

DETAILED DESCRIPTION OF THE PREFERRED EMBODIMENTS

Figure 1:
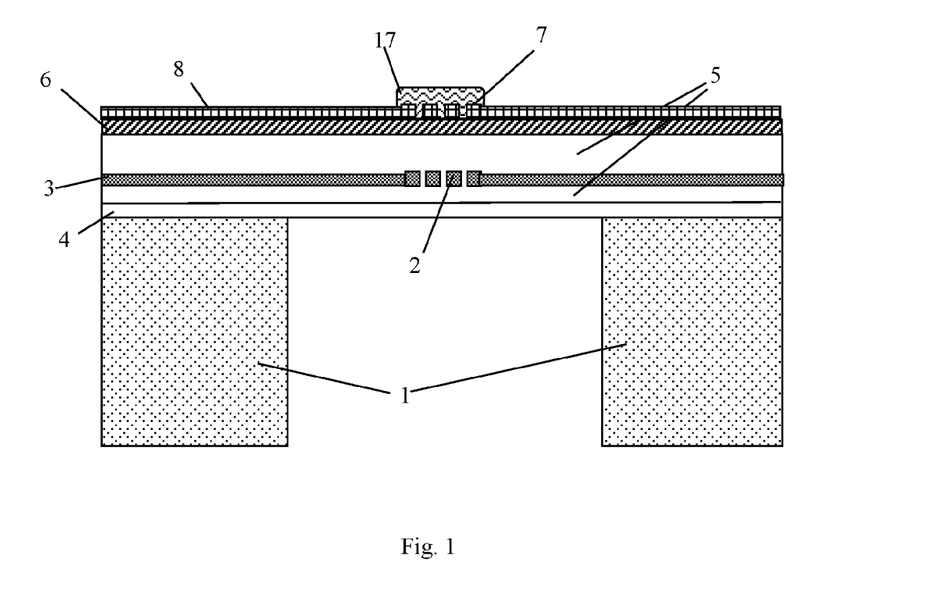
FIG. 1 shows a schematic cross-section of a micro-hotplate with electrodes and a gas sensitive material deposited on the electrodes.

FIG. 1 shows a schematic cross-section of a micro-hotplate made in a silicon semiconductor process for resistive gas sensing. The device includes a silicon substrate 1 and a membrane including an etch stop oxide 4, dielectric layers 5 (comprising silicon dioxide and/or silicon nitride) and a passivation layer 6 which is supported by the substrate 1. A resistive heater 2 is embedded within the dielectric membrane, and tracks or interconnects 3 are used to connect the heater to the pads. On top of the passivation there are electrodes 7 which can be used to make contact to a sensing material 17, and interconnect 8 which connects the electrodes to the bond pads on the chip. The etching of the substrate 1 is performed by deep reactive ion etching (DRIE) to achieve near vertical sidewalls of the cavity.

Figure 2:
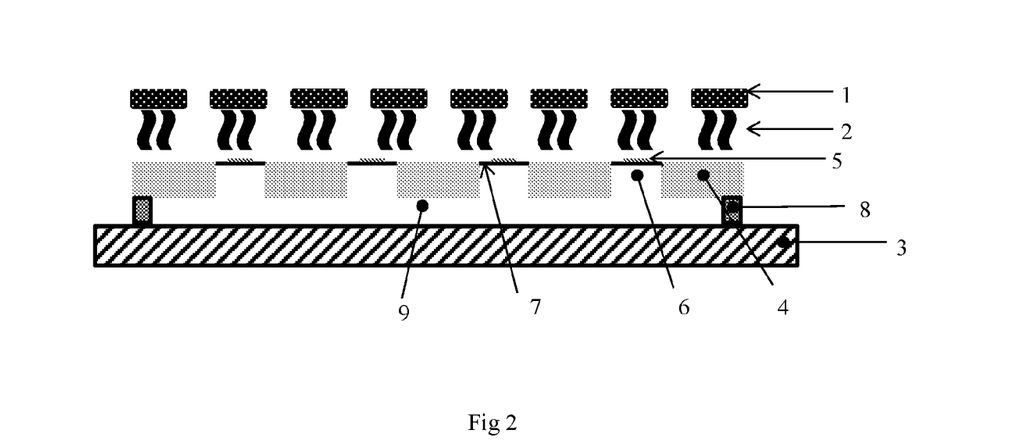
FIG. 2 shows a schematic cross-section of the method where air or gas acts as a thermally insulating material between the wafer and the base plate.

FIG. 2 shows a schematic cross-section of the IR heating process applied on multiple micro-hotplates. The multiple micro-hotplates could all be on a single chip, or a wafer. The IR heating is applied to the gas sensing material, metal oxide 5, over the electrodes. In this example, the IR heating process includes the use of a bank of IR heaters 1 and a cooled base plate (or a cooling structure) 3. The substrate 4 is heated by the IR radiation 2 from the IR heaters 1. In this particular example, the substrate 4 is represented by a silicon wafer with etched cavities 6 to form membranes 7 onto which the metal oxide (or sensing structure) 5 is deposited. The substrate 4 is separated from the cooled chuck or cooling plate by means of a support structure 8, to create a thermally isolating region 9. The gap 9 maybe filled with air or a composition of one or more gases. The pressure can also be adjusted to change the thermal coupling between the wafer and the cooled chuck. This support can be in the form of pins or pillars, or maybe a structure under the entire edge of the wafer. The support can be made of any thermally insulating material, for example glass, ceramic or quartz. The use of the thermally insulating gap allows the substrate temperature to be kept significantly higher than the cooling chuck therefore using lower IR power than would otherwise be required and reducing the risk of the large temperature difference causing warpage or fracturing due to the coefficient of thermal expansion (CTE) mismatch between the various structures on the gas sensor (e.g., silicon CTE=3 ppm/K, silicon dioxide CTE=0.5 ppm/K and tungsten CTE=4.3 ppm/K).

In one example, the metal oxide 5 is formed from a formulation comprising metal oxide powder (particulate) and a vehicle solvent. When the metal oxide powder and vehicle solvent is mixed together it forms a paste/ink which is then deposited over the sensing electrode. After the deposition, in one example, the IR heaters 1 generate an initial temperature, for example about 300° C., which enables the vehicle solvent to be evaporated and/or decomposed from the ink/paste. This is then followed by a ramp to a higher temperature, for example about 600° C., which forms a stable, porous sensing structure including metal oxide.

Rapid thermal processing (RTP) or rapid thermal annealing (RTA) relies on the use of specialist equipment generally fitted with banks of Infra-Red (IR) heaters to provide fast, controlled and uniform heat exposure to silicon wafers. This greatly reduces process time and provides a higher degree of controllability for ramp rates, dwell times and temperatures and cool rates. The use of such equipment not only enhances process control but also provides the option for back side cooling (see FIG. 2).

In the example given in FIG. 2, the membrane 7 and metal oxide 5 have very low thermal mass and the metal oxide 5 is thermally isolated from the silicon substrate due to the low thermal conductivity of the membrane (~1 W/mK). The area of the membrane onto which the electrodes and metal oxide 5 are deposited are directly over the etched portion of the substrate 4. The etched portion or the cavity 6 does not have any silicon but is only filled with air which also has very low thermal conductivity. The presence of the cavity provides the low thermal conductivity as well. The combination of the low thermal conductivity of air in the cavity and the low thermal conductivity of membrane helps to retain a high temperature applied on the metal oxide formulation. As the silicon substrate (arranged for example along the perimeter underneath the membrane 5 but not to the centre portion underneath the membrane 5) has a relative high thermal conductivity (~150 W/mK), the cooled chuck 3 will sink some of the heat from the silicon via conduction through the gap between the wafer and the cooled chuck whilst the metal oxide 5 will be heated in line with the temperature set point (e.g. 600° C.). The amount of heat that is conducted away into the cooled chuck can be managed by appropriate selection of the process gas, pressure and separation distance. Therefore a high temperature (or the first temperature) is achieved over the metal oxide formulation but a relatively low temperature (or the second temperature) is achieved in the rest of the area (near the perimeter of membrane) on which there is no electrode and metal oxide formulation. In other words, two different temperatures are selectively achieved due to the membrane structure having the back-etched portion or the cavity.

Figure 3:
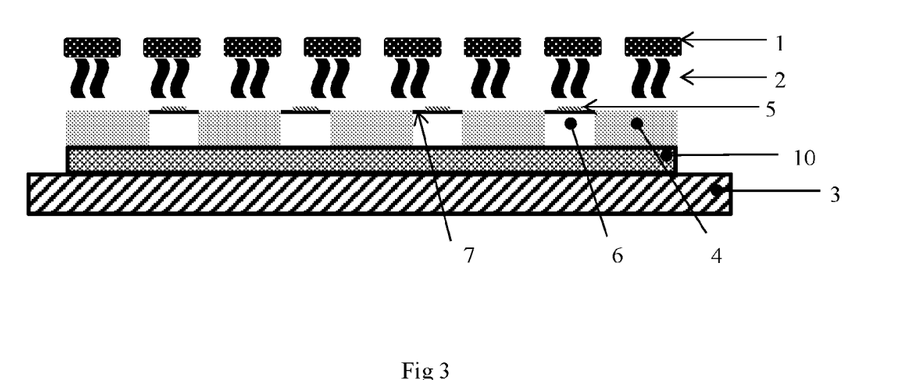
FIG. 3 shows a schematic cross-section of the IR heating technique where a thermally insulating material is present between the wafer and the base plate.

FIG. 3 shows a schematic cross-section where instead of air or gas, an insulating material 10 is used to provide the thermal insulation between the wafer and the cooling chuck. This insulating material can be, for example, glass, ceramic or quartz.

Figure 4:
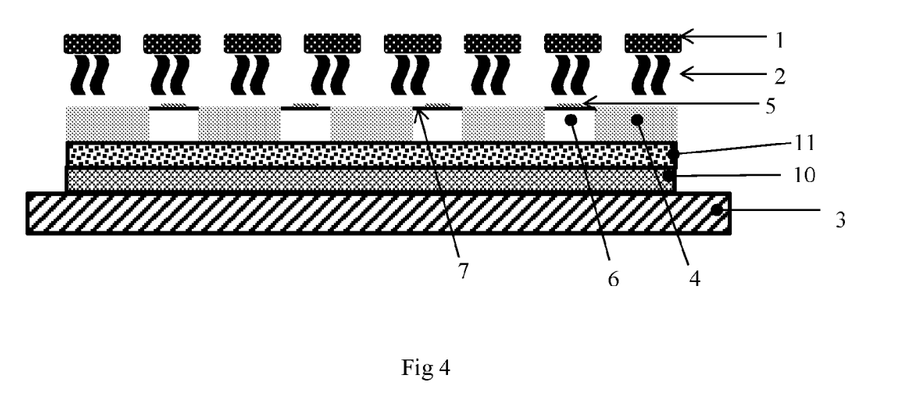
FIG. 4 shows a schematic cross-section of the IR heating technique where there is a thermally insulating material above the base plate, and a thermally conducting material above the insulating material, but below the wafer, to act as a heat spreader thus providing improved uniformity.

FIG. 4 shows a schematic cross-section where there is an insulating material 10, but also a thermally conducting material 11 between the wafer and the insulating material. This conducting material helps to make the substrate temperature uniform on the whole wafer, and can be any material with high thermal conductivity, for example a metal, silicon or silicon carbide.

Figure 5:
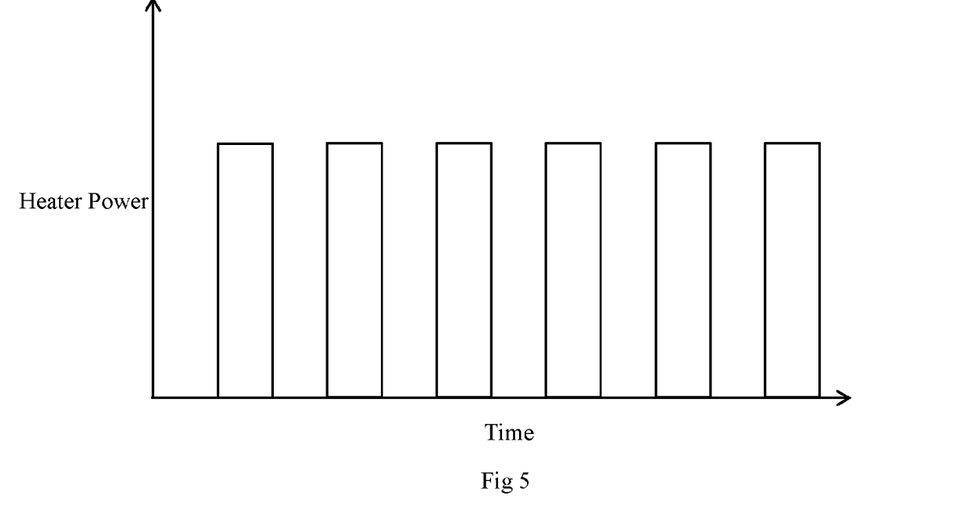
FIG. 5 shows an alternative scheme of the IR heating in a pulsed mode.

FIG. 5 shows an example of a pulse heating sequence where the IR power is varied between an off value (zero) and an on value (which can be any power level).

Figure 6:
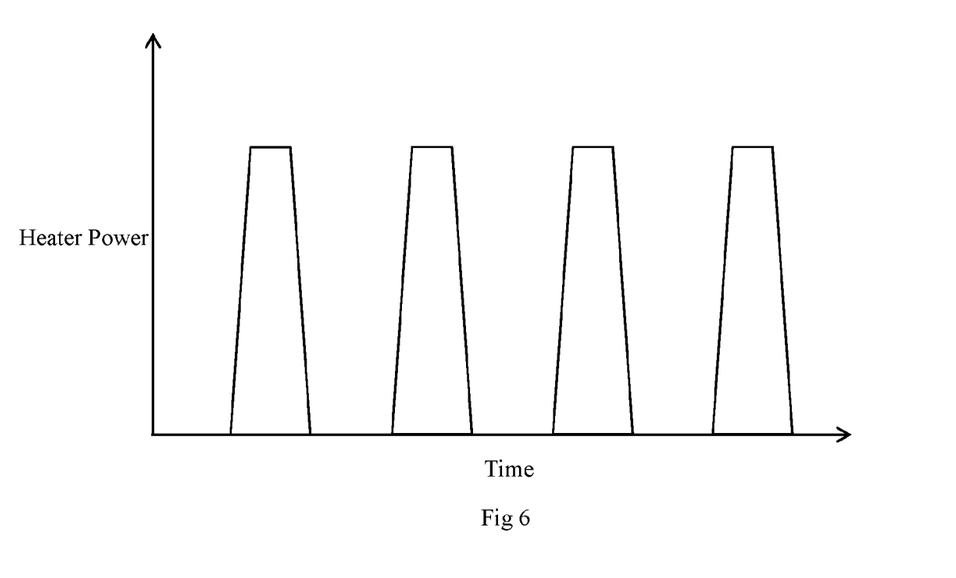
FIG. 6 shows an alternative scheme of the IR heating in a pulsed mode.

FIG. 6 shows an example of a pulse heating sequence, where the IR power is varied between an off value (zero) and an on value (any power level), where this is a small ramp up and ramp down time for the pulse.

Figure 7:
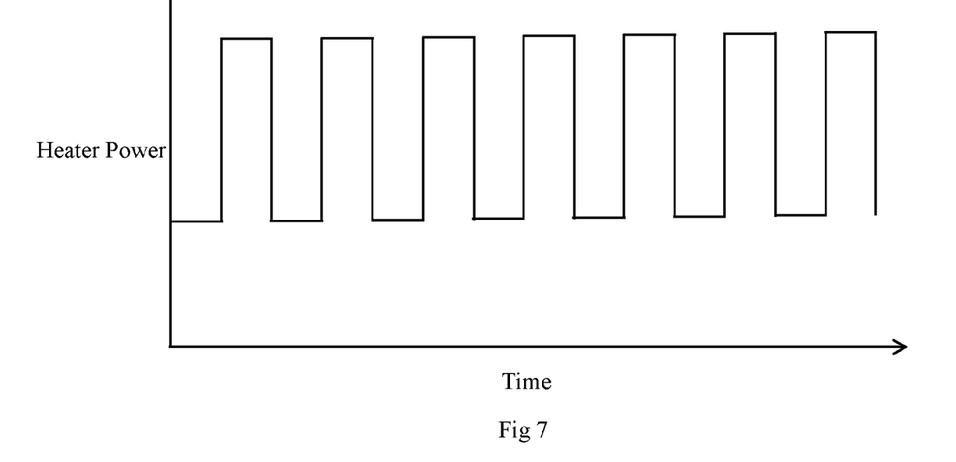
FIG. 7 shows an alternative scheme of the IR heating in a pulsed mode.

FIG. 7 shows an example of a pulse heating sequence where the IR power is varied between a low and high power value.

The pulse frequency and duty cycle should be such to reduce the overall heat input to a point that is insufficient to raise the temperature of the silicon to the set point but has sufficient energy to maintain the temperature set point on the metal oxide. Frequencies could be from 0.1-10 Hz, with possible duty cycles of 30-70%.

Further enhancements may be made by modifying the emissivity of the structures being heated. For example, a high emissivity metal oxide material will absorb more IR radiation, thus increasing in temperature, whereas a low emissivity substrate will absorb less IR radiation, thus reducing the heating effect.

This method can be used for annealing or firing materials on devices in wafer form, on individual devices or other arrays of devices arranged on a suitable substrate.

In a further alternative embodiment, deployment of laser heating techniques with a cold chuck rather than IR heaters and a cold chuck is also possible.

Figure 8:
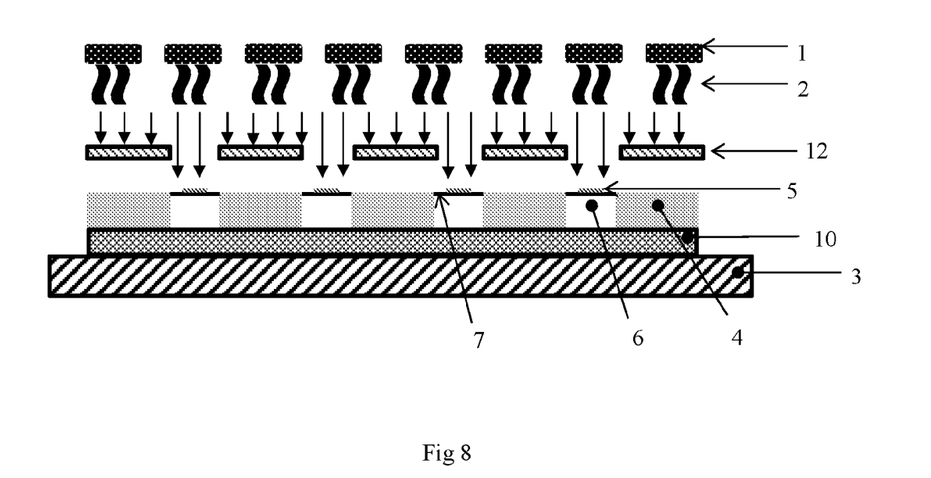
FIG. 8 shows an IR heating technique using a shadow mask between the IR heater and the wafer.

FIG. 8 shows the schematic cross-section of the IR heating technique/method where there is a shadow mask 12 between the IR heater and the wafer. The shadow mask 12 comprises of a plate with holes located above the membranes, such that it allows the IR radiation to reach the membranes, but not the parts of the wafer where the substrate 6 is not etched. The shadow mask can be made of a material with high thermal conductivity and/or high IR reflectivity. The holes in the shadow mask may only allow IR radiation to reach the membranes or may only be large enough to allow IR radiation to reach the sensing structure. The holes may also only expose some membranes or sensing structures to allow different amounts of IR radiation to reach different membranes or sensing structure, for example in case of a plurality of gas sensing formulations. The size of the holes maybe different for different membranes.

Figure 9:
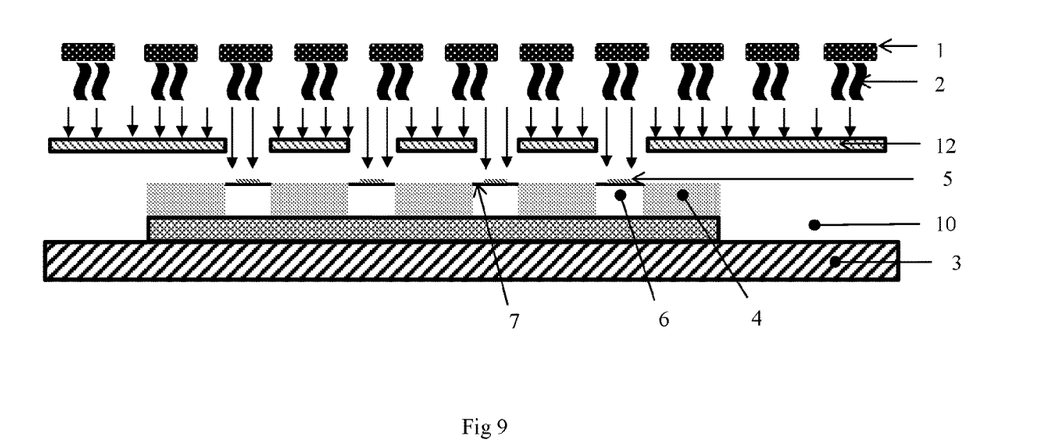
FIG. 9 shows an alternative IR heating technique using a shadow mask between the IR heater and the wafer.

FIG. 9 shows the schematic cross-section of the IR heating technique, where there is shadow mask 12 between the IR heater and the wafer, and the shadow mask 12 extends well beyond the edge of the wafer. The shadow mask 12 can extend up to the walls of the chamber used for the IR heating.

Figure 10:
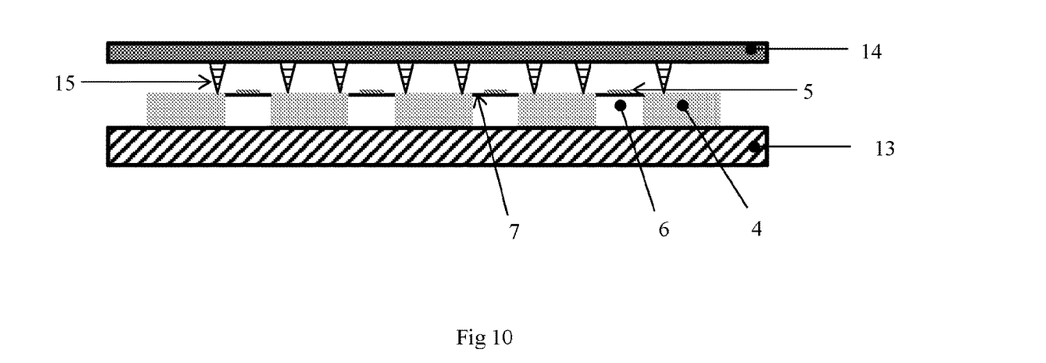
FIG. 10 shows an alternative possible setup for heating the gas sensing formulation.

FIG. 10 shows the schematic cross-section of a possible setup for heating the gas sensing formulation. This comprises placing the entire wafer on a probe station chuck 13. A probe card 14 is positioned above the wafer, and probes 15 contact the bond pads on the wafer to make electrical connection between the probe card and the membrane heaters. This connection is then used to provide a bias voltage or current to the heater to heat the gas sensing formulation to a high temperature. Various different designs and shapes are possible for probes and the probe card, and the number of membrane heaters operated at the same time can also be different. The bias voltage or current provided to the heater may vary between different heaters in order to provide different temperatures to heat a plurality of gas sensing formulations.

Although the invention has been described in terms of preferred embodiments as set forth above, it should be understood that these embodiments are illustrative only and that the claims are not limited to those embodiments. Those skilled in the art will be able to make modifications and alternatives in view of the disclosure which are contemplated as falling within the scope of the appended claims. Each feature disclosed or illustrated in the present specification may be incorporated in the invention, whether alone or in any appropriate combination with any other feature disclosed or illustrated herein.

The invention claimed is:

1. A method for heating a gas sensing material formulation on a micro-hotplate comprising:
    forming a dielectric membrane on a semiconductor substrate that includes an etched portion; and
    disposing the gas sensing material formulation on one side of the dielectric membrane;
    the method comprising:
    selectively heating the gas sensing material formulation using an infra-red (IR) heater located over the substrate, and
    controllably cooling the semiconductor substrate using a cooling plate positioned under the substrate and using a thermally insulating medium located between the substrate and the cooling plate so that a gas sensing structure is formed on said one side of the dielectric membrane from the gas sensing material formulation, wherein
    the thermally insulating medium extends under non-etched portions of the substrate.

2. A method for forming a gas sensing structure from a gas sensing material formulation on a micro-hotplate comprising:
    forming a dielectric membrane on a semiconductor substrate that includes an etched portion;
    growing or depositing the gas sensing material formulation on one side of the dielectric membrane; and selectively heating the gas sensing material formulation using an infra-red (IR) heater located over the substrate, and controllably cooling the semiconductor substrate using a cooling plate provided under the substrate and using a thermally insulating medium located between the substrate and the cooling plate so that a gas sensing structure is formed on said one side of the dielectric membrane from the gas sensing material formulation, wherein the thermally insulating medium extends under non-etched portions of the substrate.

3. The method according to claim 2, further comprising heating the dielectric membrane such that a first temperature is applied to the gas sensing material formulation to form the gas sensing structure and a second temperature lower than the first temperature is generated in an area of the dielectric membrane on which no sensing structure is formed, wherein:

the area of the dielectric membrane in which the second temperature is generated is supported by the semiconductor substrate, wherein the heat generated by the step of selectively heating substantially dissipates through the semiconductor substrate using the thermally insulating medium and cooling plate; and/or the first temperature is set about 600° C. and the second temperature is about or less than 400° C.

4. The method according to claim 2, wherein either:
the thermally insulating medium comprises an air or gas gap; or
the thermally insulating medium comprises a plate with low thermal conductivity, wherein the plate is selected from a group comprising glass, ceramic and quartz.

5. The method according to claim 2, wherein a thermally conducting material is provided between the thermally insulating medium and the semiconductor substrate, optionally wherein the thermally conducting material has a higher thermal conductivity than the thermally insulating medium.

6. The method according to claim 2, wherein a support structure is provided between the cooling plate and the semiconductor substrate, wherein any one of:
the support structure comprises a thermally insulating material selected from any one of glass, ceramic and quartz; or
the support structure comprises pins or pillars; or
the support structure is provided under an entire edge of the semiconductor substrate.

7. The method according to claim 2, wherein:
a temperature of the cooling plate is set about 300° C.; and/or
the cooling plate is cooled by using water and wherein a temperature of the water is based on the degree of thermal coupling between the cooling plate and the substrate, wherein the degree of thermal coupling between the cooling plate and the substrate is controlled by an effective thermal conductivity of the insulating medium.

8. The method according to claim 2, wherein the step of selectively heating is generated by a pulsed heating technique, wherein the pulsed heating technique is applied using a pulse frequency that generates a first temperature applied to the gas sensing material formulation and generates a second temperature applied to an area of the dielectric membrane where no sensing structure is formed, wherein either:
the pulse applied in the pulse heating technique is between zero power and a high heater power; or
the pulse applied in the pulse heating technique is between a low heater power and a high heater power.

9. The method according claim 2, further comprising:
controlling an atmosphere of the selective heating step at a predetermined pressure of about 200 Torr to 750 Torr; and/or
wherein either:
the atmosphere of the selective heating step comprises a process gas that is inert, oxidising or reducing; or
the atmosphere of the selective heating comprises a process gas selected from a group comprising oxygen, nitrogen, carbon monoxide, argon and a forming gas; and/or
controlling the oxygen partial pressure at about or less than 20 parts-per-million (ppm).

10. The method according to claim 2, wherein either:
the gas sensing material formulation is located on the dielectric membrane above an area of the etched portion of the substrate; or
the gas sensing material formulation is located below the dielectric membrane within the area of the etched portion of the substrate.

11. The method according to claim 2, wherein the micro-hotplate further comprises a membrane heater formed within or over the dielectric membrane, wherein:
the membrane heater is a resistive heater comprising a CMOS usable material comprising aluminium, copper, titanium, molybdenum, polysilicon, single crystal silicon, tungsten, or titanium nitride; and/or
the membrane heater comprises a CMOS interconnect metal, and the dielectric membrane comprises CMOS dielectric layers.

12. The method according to claim 11, further comprising applying a voltage or current to the membrane heater to heat the gas sensing formulation to form the gas sensing structure, wherein:
the applying the voltage or current to the membrane heater is performed after applying the selective heating using the IR heater; or
wherein the applying the voltage or current to the membrane heater is performed prior to applying the selective heating using the IR heater; and/or
the applying the voltage or current to the membrane heater and applying selective heating by the IR heater are performed alternatively in a plurality of cycles; and/or
the applying the voltage or current to the membrane heater is performed using a pulsed technique; and/or
the applying the voltage or current to the membrane heater is varied between membrane heaters with respect to the level of voltage or current applied.

13. The method according to claim 2, further comprising using a shadow mask above the micro-hotplate, the shadow mask comprising a hole that aligns with the etched portion of the substrate, further comprising:
applying the IR heating to the gas sensing formulation through the hole of the shadow mask and blocking the IR heating to an area obscured by the shadow mask where no gas sensing formulation is formed; and/or
providing the shadow mask to cover the wafer and the entire cooling plate; and/or
wherein the shadow mask comprises a thermally conductive material and/or reflects IR radiation from the IR heater.

14. The method according to claim 2, wherein:
the gas sensing material formulation comprises a gas sensitive particulate material and a solvent, wherein the solvent is evaporated by the application of the heat generated by the IR heater to form the sensing structure; and/or the sensing structure comprises a metal oxide material or a combination of metal oxides, wherein:

the sensing structure comprises a metal oxide material selected from a group comprising tin oxide, tungsten oxide, zinc oxide, chromium oxide, aluminium oxide; and/or the metal oxide material is pure, doped or catalysed material.

15. The method according to claim 2, wherein:

the sensing structure is a porous layer; and/or the sensing structure is a gas sensitive layer; and/or the micro-hotplate is a CMOS based micro-hotplate; and/or the sensing structure is deposited using a technique selected from a group comprising screen printing, sputtering, chemical vapour deposition (CVD), atomic layer deposition (ALD), ink-jet, drop coating and flame spray pyrolysis; and/or the dielectric membrane is formed using an etching technique for back-etching the substrate, the etching technique being selected from a group comprising deep reactive ion etching (DRIE), anisotropic or crystallographic wet etching, potassium hydroxide (KOH) and tetramethyl ammonium hydroxide (TMAH); and/or the micro-hotplate comprises a gas sensing electrode under the gas sensing structure.

16. The method according to claim 2, wherein the dielectric membrane comprises:

a membrane cavity comprising vertical side walls or sloping side walls;

one or more dielectric layers comprising silicon dioxide and/or silicon nitride;

additional structures comprising metal, crystalline silicon and/or polysilicon;

one or more layers of spin on glass, and a passivation layer over the one or more dielectric layers, wherein an electrode layer is formed over the passivation layer of the dielectric membrane, wherein:

the electrode layer is formed under the dielectric membrane; and/or the electrode layer comprises a plurality of patterned structures, wherein the patterned structures have one or more shapes selected from a group comprising:

(1) square and/or circular (2) interdigitated electrodes (3) electrodes arranged in shapes of concentric rings, and (4) spiral shaped electrodes.

17. The method according to claim 2, wherein the step of selectively heating is applied to an array of micro-hotplates, wherein a temperature of each micro-hotplate in the array is changed to control the heating of the gas sensing material formulation, further wherein the temperature of each micro-hotplate in the array is changed by changing the thermal conductivity of each dielectric membrane, wherein the thermal conductivity of each dielectric membrane is changed by adjusting an amount of metal being provided with the dielectric membrane.

18. The method according to claim 2 wherein the micro-hotplate comprises CMOS electronic circuits.

* * * * *

UNITED STATES PATENT AND TRADEMARK OFFICE
CERTIFICATE OF CORRECTION

PATENT NO. : 10,705,040 B2
APPLICATION NO. : 16/061428
DATED : July 7, 2020
INVENTOR(S) : Simon Jonathan Stacey et al.

Page 1 of 1

It is certified that error appears in the above-identified patent and that said Letters Patent is hereby corrected as shown below:

In the Claims

In Column 11, Line 36, Claim 5, delete "optionally".

Signed and Sealed this
Eighth Day of September, 2020

Andrei Iancu
*Director of the United States Patent and Trademark Office*